(12) United States Patent
Pyo et al.

(10) Patent No.: US 10,361,170 B2
(45) Date of Patent: Jul. 23, 2019

(54) SEMICONDUCTOR PACKAGE

(71) Applicant: Samsung Electronics Co., Ltd., Suwon-si, Gyeonggi-do (KR)

(72) Inventors: Sungeun Pyo, Suwon-si (KR); Jongbo Shim, Hwasung (KR); Ji Hwang Kim, Hwasung (KR); Chajea Jo, Hwasung (KR); Sang-Uk Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/837,187

(22) Filed: Dec. 11, 2017

(65) Prior Publication Data
US 2018/0175001 A1    Jun. 21, 2018

(30) Foreign Application Priority Data

Dec. 16, 2016    (KR) .................. 10-2016-0172919

(51) Int. Cl.
| | |
|---|---|
| H01L 23/495 | (2006.01) |
| H01L 25/065 | (2006.01) |
| H01L 23/538 | (2006.01) |
| H01L 21/48 | (2006.01) |
| H01L 25/00 | (2006.01) |
| H01L 23/00 | (2006.01) |

(52) U.S. Cl.
CPC ........ *H01L 25/0652* (2013.01); *H01L 21/481* (2013.01); *H01L 21/4853* (2013.01); *H01L 21/4857* (2013.01); *H01L 23/5381* (2013.01); *H01L 23/5383* (2013.01); *H01L 23/5385* (2013.01); *H01L 23/5386* (2013.01); *H01L 24/16* (2013.01); *H01L 25/0655* (2013.01); *H01L 25/50* (2013.01); *H01L 2224/0401* (2013.01); *H01L 2224/0557* (2013.01); *H01L 2224/16145* (2013.01); *H01L 2224/16227* (2013.01); *H01L 2224/1703* (2013.01); *H01L 2224/17181* (2013.01); *H01L 2224/32225* (2013.01); *H01L 2224/73204* (2013.01); *H01L 2225/06513* (2013.01); *H01L 2225/06517* (2013.01); *H01L 2225/06541* (2013.01); *H01L 2225/06555* (2013.01); *H01L 2225/06565* (2013.01); *H01L 2924/15311* (2013.01)

(58) Field of Classification Search
None
See application file for complete search history.

(56) References Cited

U.S. PATENT DOCUMENTS

| | | | |
|---|---|---|---|
| 7,402,901 B2 | 7/2008 | Hatano et al. | |
| 7,964,952 B2 | 6/2011 | Lee | |
| 8,227,904 B2 | 7/2012 | Braunisch et al. | |
| 8,232,658 B2 | 7/2012 | Chow et al. | |

(Continued)

*Primary Examiner* — Kevin M Picardat
(74) *Attorney, Agent, or Firm* — Harness, Dickey & Pierce, P.L.C.

(57) ABSTRACT

A semiconductor package including a first substrate including first upper pads, the first upper pads on a top surface of the first substrate, a second substrate including second upper pads, the second upper pads on a top surface of the second substrate, a pitch of the second upper pads being less than a pitch of the first upper pads, and a first semiconductor chip on and electrically connected to both (i) at least one of the first upper pads and (ii) at least one of the second upper pads may be provided.

18 Claims, 13 Drawing Sheets

(56) References Cited

U.S. PATENT DOCUMENTS

| | | |
|---|---|---|
| 8,400,779 B2 | 3/2013 | Kim et al. |
| 8,704,364 B2 | 4/2014 | Banijamali |
| 8,823,144 B2 | 9/2014 | Khan et al. |
| 8,900,922 B2 | 12/2014 | Lin et al. |
| 9,136,236 B2 * | 9/2015 | Starkston ............ H01L 23/5385 |
| 9,171,816 B2 * | 10/2015 | Teh ..................... H01L 23/3114 |
| 2010/0327424 A1 * | 12/2010 | Braunisch ............... H01L 23/13 |
| | | 257/692 |
| 2015/0091179 A1 * | 4/2015 | Shenoy ................. H01L 23/481 |
| | | 257/774 |
| 2015/0327367 A1 * | 11/2015 | Shen .................. H01L 23/5381 |
| | | 361/767 |
| 2016/0302308 A1 * | 10/2016 | Lee ...................... H05K 3/4694 |
| 2016/0329284 A1 * | 11/2016 | We ..................... H01L 25/0652 |
| 2016/0343666 A1 * | 11/2016 | Deshpande ............. H01L 23/13 |
| 2017/0229409 A1 * | 8/2017 | Hu ......................... H01L 24/08 |

\* cited by examiner

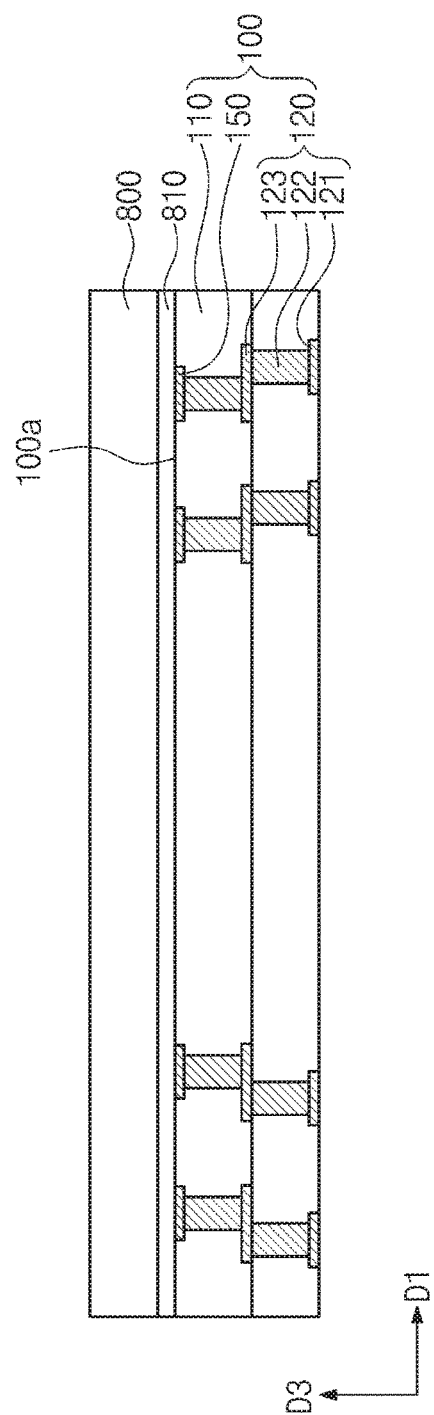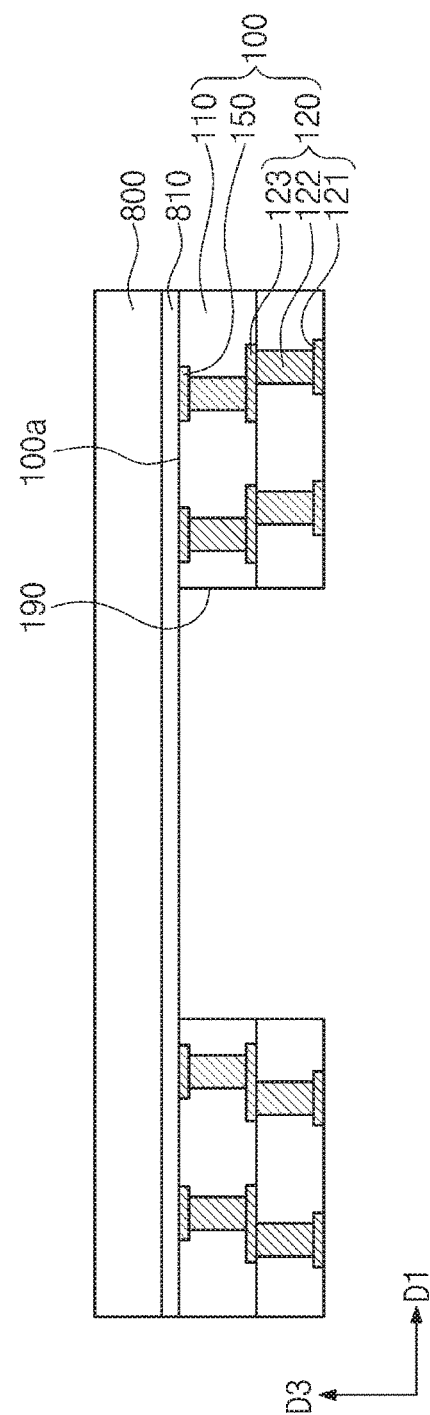

SEMICONDUCTOR PACKAGE

CROSS-REFERENCE TO RELATED APPLICATION

This U.S. non-provisional patent application claims priority under 35 U.S.C. § 119 to Korean Patent Application No. 10-2016-0172919, filed on Dec. 16, 2016, in the Korean Intellectual Property Office, the disclosure of which is hereby incorporated by reference in its entirety.

BACKGROUND

Some example embodiments of the inventive concepts relate to semiconductor packages and, more particularly, to electrical connections of semiconductor packages.

A semiconductor chip may be realized in the form of a semiconductor package so as to be suitably applied to electronic products. In a general semiconductor package, the semiconductor chip may be mounted on a printed circuit board (PCB) and may be electrically connected to the PCB through bonding wires or bumps. High-performance integrated circuits of the semiconductor chip have been increasingly demanded with the development of an electronic industry. Thus, the integrated circuits of the semiconductor chip have been variously designed.

SUMMARY

Some example embodiments of the inventive concepts may provide semiconductor packages with high reliability.

Some example embodiments of the inventive concepts may also provide semiconductor packages having various pitches.

According to an example embodiment, a semiconductor package may include. a first substrate including first upper pads, the first upper pads on a top surface of the first substrate, a second substrate including second upper pads, the second upper pads on a top surface of the second substrate, a pitch of the second upper pads being less than a pitch of the first upper pads, and a first semiconductor chip on and electrically connected to both (i) at least one of the first upper pads and (ii) at least one of the second upper pads.

According to an example embodiment, a semiconductor package may include a first substrate having a hole, a second substrate in the hole of the first substrate, at least one semiconductor chip on the first substrate and the second substrate, first connection parts between the first substrate and the semiconductor chip, and second connection parts between the second substrate and the semiconductor chip. A pitch of the second connection parts may be less than a pitch of the first connection parts.

According to an example embodiment, a semiconductor package may include a plurality of semiconductor chips laterally arranged, first pads on surfaces of the semiconductor chips, second pads on the surfaces of the semiconductor chips, a first substrate electrically connected to the semiconductor chips through the first pads, the first substrate facing the surfaces of the semiconductor chips, and a second substrate electrically connected to the semiconductor chips through the second pads, the second substrate facing the surfaces of the semiconductor chips, a pitch of the second pads being less than a pitch of the first pads.

According to an example embodiment, a semiconductor package may include a first substrate including first substrate pads on a first surface thereof, the first substrate pads having a first pitch, a second substrate including second substrate pads on a first surface thereof, the second substrate pads having a second pitch, the second pitch being less than the first pitch, and a first semiconductor chip including first chip pads and second chip pads, the first chip pads having a third pitch, the second chip pads having a fourth pitch, the fourth pitch being less than the third pitch, the first semiconductor chip on both at least one of the first substrate pads and at least one of the second substrate pads such that one of the first chip pads is electrically coupled to the at least one of the first substrate pads and one of the second chip pads is electrically coupled to the at least one of the second substrate pads.

BRIEF DESCRIPTION OF THE DRAWINGS

The inventive concepts will become more apparent in view of the attached drawings and accompanying detailed description.

FIGS. 8A to 8E are cross-sectional views illustrating a method of manufacturing a semiconductor package, according to an example embodiment of the inventive concepts.

DETAILED DESCRIPTION

Semiconductor packages and methods of manufacturing the same according to some example embodiments of the inventive concepts will be described hereinafter.

Figure 1A:
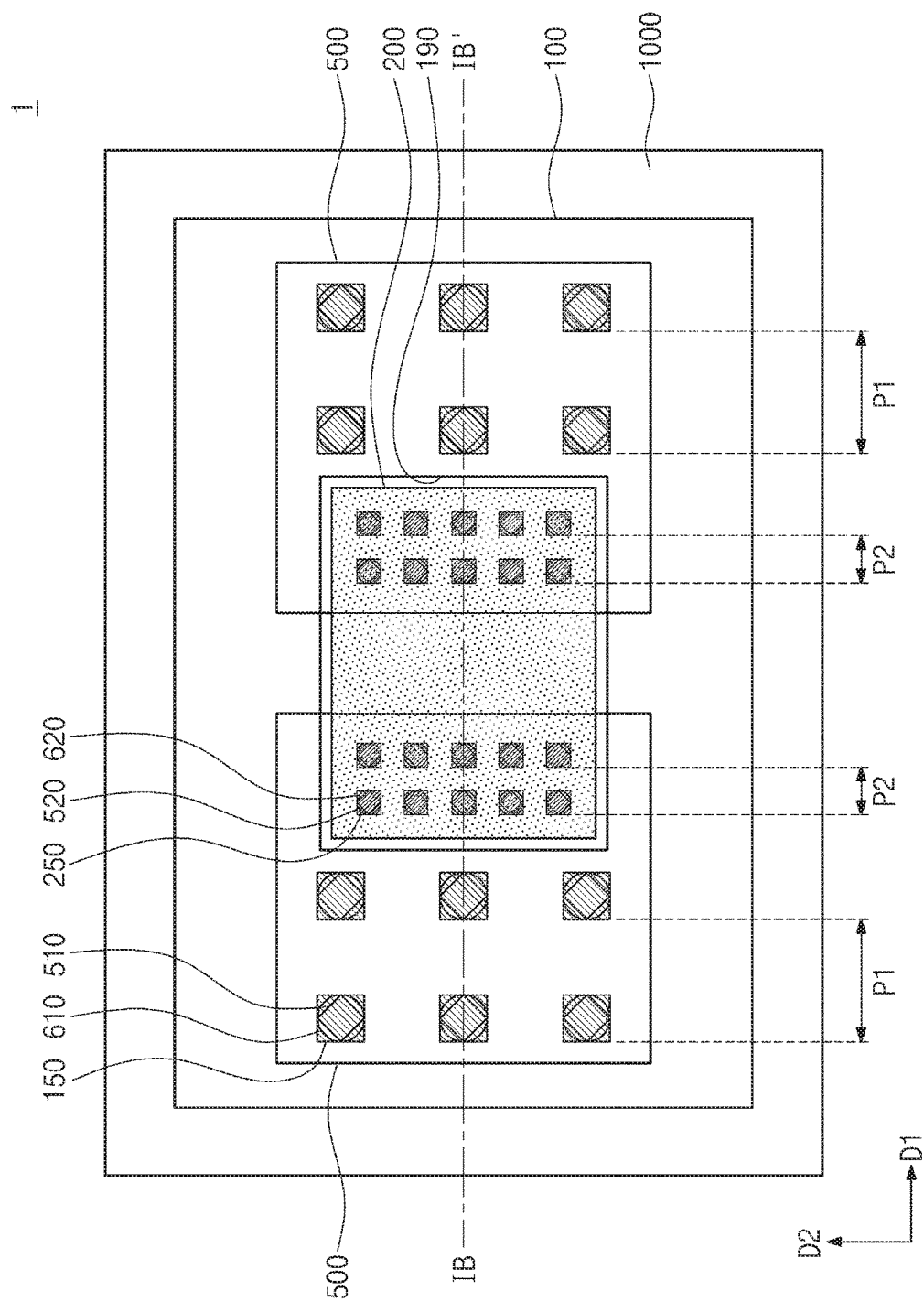
FIG. 1A is a plan view illustrating a semiconductor package according to an example embodiment of the inventive concepts.
Figure 1B:
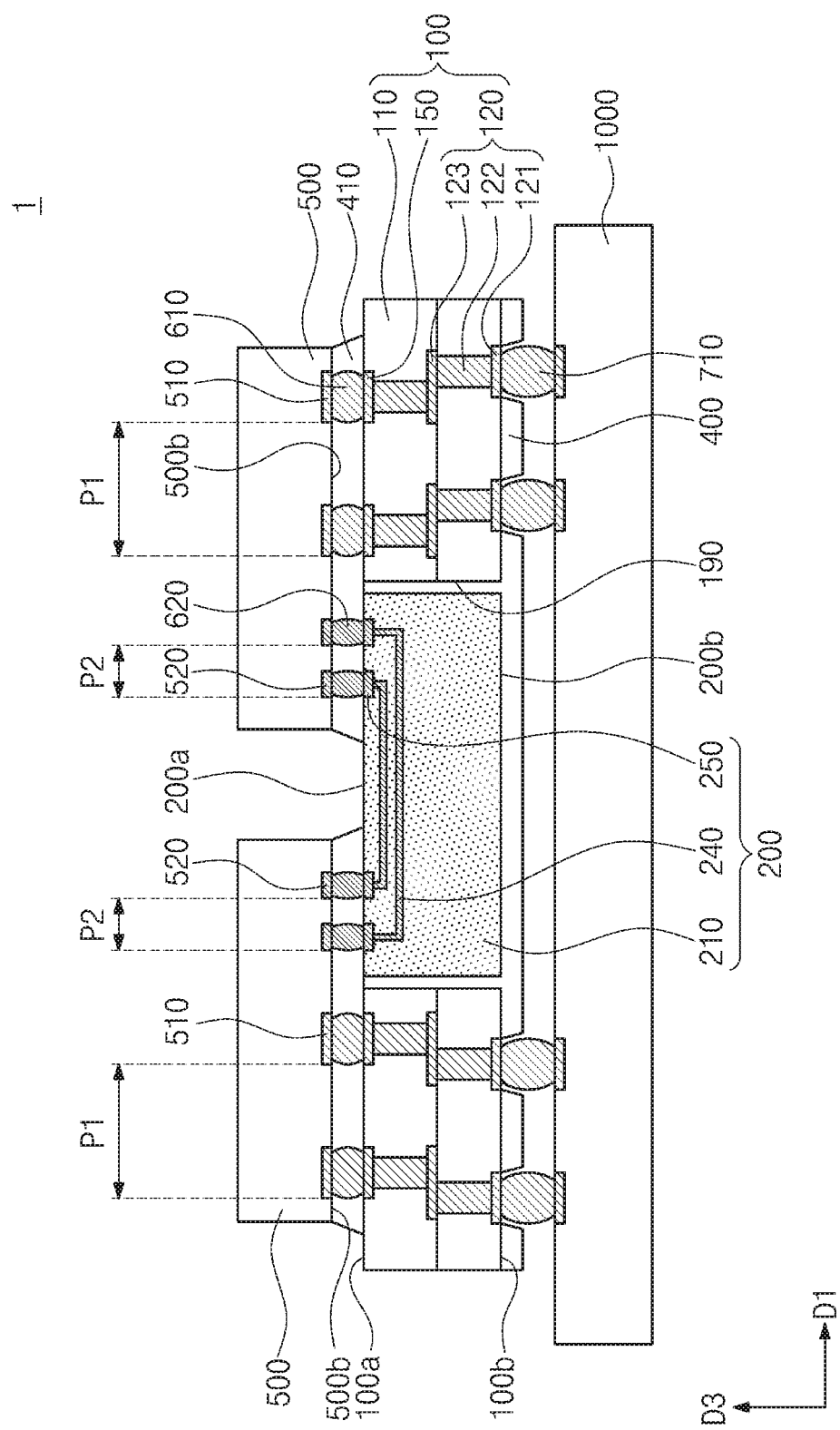
FIG. 1B is a cross-sectional view taken along a line IB-IB' of FIG. 1A.

FIG. 1A is a plan view illustrating a semiconductor package according to an example embodiment of the inventive concepts. FIG. 1B is a cross-sectional view taken along a line IB-IB' of FIG. 1A.

Referring to FIGS. 1A and 1B, a semiconductor package 1 may include a package substrate 1000, first bumps 710, a first substrate 100, a second substrate 200, a molding pattern 400, and semiconductor chips 500. The package substrate 1000 may include a printed circuit board (PCB).

The first substrate 100 may be disposed on the package substrate 1000. The first substrate 100 may include a printed circuit board (PCB). The first substrate 100 may include a first base layer 110, first conductive structures 120, and first upper pads 150. The first base layer 110 may include a plurality of first base layers 110 sequentially stacked. The first base layers 110 may include an insulating material. For example, the first base layers 110 may include polymer or ceramic. The first conductive structures 120 may include first lower pads 121, first vias 122, and first conductive patterns 123. The first lower pads 121 may be provided on a bottom surface 100b of the first substrate 100. The first vias 122 may penetrate the first base layers 110. The first conductive patterns 123 may be disposed between the first base layers 110 and may be connected to the first vias 122. The first upper pads 150 may be provided on a top surface 100a of the first substrate 100 and may be respectively connected to corresponding ones of the first vias 122. The top surface 100a of the first substrate 100 may be opposite to the bottom surface 100b of the first substrate 100. The first upper pads 150 may not be aligned with the first lower pads 121 in a third direction D3. Thus, the degree of freedom of arrangement of the first upper pads 150 may be increased. A first direction D1 and a second direction D2 may be parallel to the top surface 100a of the first substrate 100. The second direction D2 may intersect the first direction D1. The third direction D3 may be substantially perpendicular to the top surface 100a of the first substrate 100. The first bumps 710 may be disposed between the first substrate 100 and the package substrate 1000. The first bumps 710 may be electrically connected to the first conductive structures 120 and the package substrate 1000. The first conductive structures 120 may transmit signals to semiconductor chips 500, may supply voltages to the semiconductor chips 500, and/or may ground the semiconductor chips 500. The first conductive structures 120 may be electrically isolated from each other. Even though not shown in the drawings, first interconnection patterns may be provided on the top surface 100a of the first substrate 100, and widths of the first interconnection patterns may be greater than 10 μm. A distance between the first interconnection patterns may be greater than 10 μm. The first substrate 100 may have a hole 190 penetrating the first substrate 100. The hole 190 may penetrate the first substrate 100 from the top surface 100a to the bottom surface 100b.

The second substrate 200 may be provided in the hole 190 of the first substrate 100. The second substrate 200 may be spaced apart from the first substrate 100. A top surface 200a of the second substrate 200 may be disposed at substantially the same level as the top surface 100a of the first substrate 100. A printed circuit board may be used as the second substrate 200. The second substrate 200 may include a second base layer 210, an interconnection line 240, and second upper pads 250. The second base layer 210 may include polymer or ceramic. Even though not shown in the drawings, the second base layer 210 may include a plurality of stacked layers. If a difference in thermal expansion coefficients between the first and second substrates 100 and 200 is great, a crack may occur in the first substrate 100 and/or the second substrate 200 during operation of the semiconductor package 1. For example, if the second substrate 200 includes a semiconductor chip, a difference in coefficient of thermal expansion between the first and second substrates 100 and 200 may be great. According to some example embodiments of the inventive concepts, the first substrate 100 and the second substrate 200 may include the printed circuit boards. Thus, reliability of the semiconductor package 1 may be improved. Even though not shown in the drawings, second interconnection patterns may be provided on the top surface 200a of the second substrate 200, and widths of the second interconnection patterns may be smaller than 10 μm. A distance between the second interconnection patterns may be smaller than 10 μm.

The second upper pads 250 may be provided on the top surface 200a of the second substrate 200. A pitch of the second upper pads 250 may be smaller than a pitch of the first upper pads 150. The second upper pads 250 may function as pads for transmitting signals. The interconnection line 240 may be provided in the second substrate 200 (e.g., the second base layer 210). Unlike FIG. 1B, the interconnection line 240 may be disposed on the top portion of the second substrate 200. The interconnection line 240 may be electrically connected to at least two of the second upper pads 250. A plurality of the semiconductor chips 500 may be provided on the top surface 100a of the first substrate 100 and the top surface 200a of the second substrate 200. The semiconductor chips 500 may be laterally spaced apart from each other. For example, the semiconductor chips 500 may be spaced apart from each other in the first direction D1. Each of the semiconductor chips 500 may overlap with the first substrate 100 and the second substrate 200 when viewed in a plan view. Each of the semiconductor chips 500 may be disposed on the first upper pads 150 and the second upper pads 250.

First pads 510 and second pads 520 may be provided on surfaces 500b of the semiconductor chips 500. The first pads 510 and the second pads 520 may overlap with the first upper pads 150 and the second upper pads 250, respectively, when viewed in a plan view. The surfaces 500b of the semiconductor chips 500 may function as active surfaces. The surfaces 500b of the semiconductor chips 500 may face the first substrate 100 and the second substrate 200. The first pads 510 and the second pads 520 may be electrically connected to circuit patterns (not shown) disposed in the semiconductor chips 500. In the present specification, electrical connection to the semiconductor chip 500 may mean electrical connection to the circuit patterns disposed in the semiconductor chip 500. The first pads 510 and the second pads 520 may include a conductive material (e.g., metal). The first pads 510 may overlap with the first substrate 100 when viewed in a plan view. The first pads 510 may have a first pitch P1. Here, the term 'pitch' may mean a distance between two corresponding sidewalls of adjacent two of repeatedly arranged elements.

First connection parts 610 may be disposed between the first substrate 100 and the semiconductor chips 500. The first connection parts 610 may be electrically connected to the first upper pads 150 and the first pads 510. The semiconductor chips 500 may be electrically connected to the first substrate 100 through the first connection parts 610. That the semiconductor chip 500 is electrically connected to the first substrate 100 may mean that the semiconductor chip 500 is electrically connected to at least one of the first conductive structures 120. The first conductive structures 120 may transmit/receive electrical signals to/from the semiconductor chips 500, may supply voltages to the semiconductor chips 500, and/or may ground the semiconductor chips 500. The first connection parts 610 may overlap with the first pads 510 and the first upper pads 150 when viewed in a plan view. A pitch of the first connection parts 610 may be substantially equal to the first pitch P1 of the first pads 510 and a pitch of the first upper pads 150. The first upper pads 150 may not be aligned with the first lower pads 121 in the third direction D3, and thus the degree of freedom of the arrangement of the first upper pads 150 may be increased. Accordingly, limitations on a design of the circuit patterns in the semiconductor chips 500 may be reduced. Each of the first connection parts 610 may include a solder ball, a bump, or a pillar. The first connection parts 610 may include a conductive material (e.g., metal).

The second pads 520 may overlap with the second substrate 200 when viewed in a plan view. The second pads 520 may be arranged at a second pitch P2. The second pitch P2 may be different from the first pitch P1. In particular, the second pitch P2 may be smaller than the first pitch P1.

Second connection parts 620 may be disposed between the second substrate 200 and the semiconductor chips 500. The semiconductor chips 500 may be electrically connected to the second substrate 200 through the second pads 520 and the second connection parts 620. One of the semiconductor chips 500 may be electrically connected to one or some of the first upper pads 150 and one or some of the second connection parts 620. Another of the semiconductor chips 500 may be electrically connected to another or others of the first upper pads 150 and another or others of the second connection parts 620. The interconnection line 240 may electrically connect one of the second upper pads 250 to another of the second upper pads 250. Thus, the semiconductor chips 500 may be electrically connected to the interconnection line 240 through the second connection parts 620. The semiconductor chips 500 may transmit electrical signals to each other through the interconnection line 240. Each of the second connection parts 620 may include, for example, a solder ball, a bump, or a pillar. The second connection parts 620 may include a conductive material (e.g., metal). The second connection parts 620 may overlap with the second upper pads 250 and the second pads 520, respectively, when viewed in a plan view. The second connection parts 620 may be electrically connected to the second upper pads 250 to the second pads 520. A pitch of the second connection parts 620 may be substantially equal to the second pitch P2 of the second pads 520 and a pitch of the second upper pads 250. The pitch of the second connection parts 620 may be smaller than the pitch of the first connection parts 610.

If the second substrate 200 is omitted, the second pads 520 may be arranged at the same or similar pitch as the first pads 510. In this case, the designs of the circuit patterns of the semiconductor chips 500 may be limited or constrained. If the second substrate 200 is omitted, the first upper pads 150 may be arranged at various pitches. In this case, a process of manufacturing the first substrate 100 may be complicated. According to some example embodiments, the second substrate 200 may relax design constraints for the circuit patterns of the semiconductor chips 500. Because the semiconductor chips 500 are mounted on the first substrate 100 as well as on the second substrate 200, the process of manufacturing the first substrate 100 may be simplified. The semiconductor chips 500 may be easily electrically connected to each other by the second substrate 200. In other words, the semiconductor chips 500 may be electrically connected to each other through the interconnection line 240 of the second substrate 200.

Underfill layers 410 may be provided on the surfaces 500b of the semiconductor chips 500, respectively. The underfill layers 410 may seal the first connection parts 610 and the second connection parts 620. The molding pattern 400 may be provided between the first substrate 100 and the second substrate 200. The molding pattern 400 may further extend onto the bottom surface 100b of the first substrate 100 and a bottom surface 200b of the second substrate 200. The bottom surface 200b of the second substrate 200 may be opposite to the top surface 200a of the second substrate 200. The molding pattern 400 may include an insulating polymer material.

Figure 2:
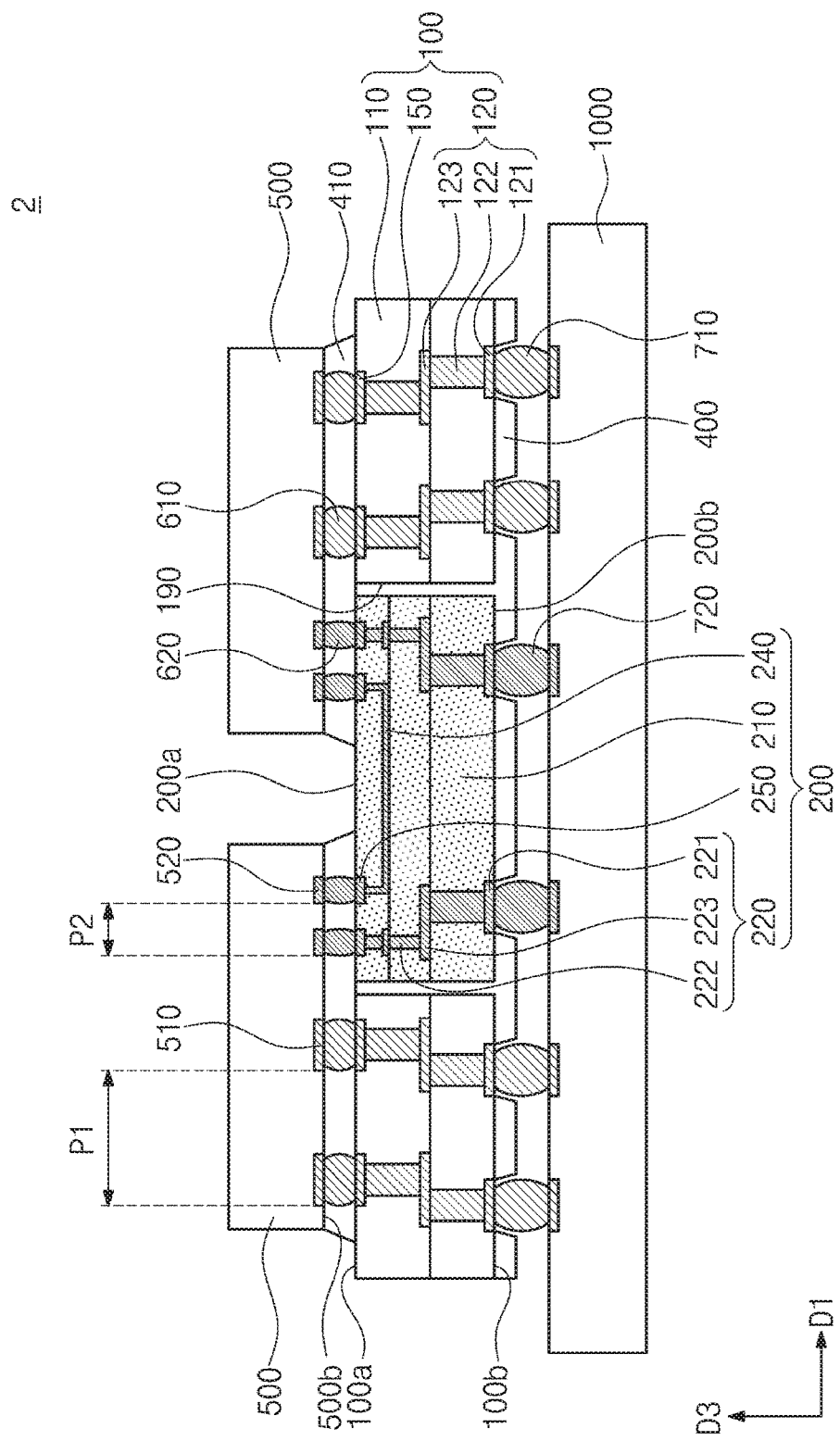
FIG. 2 is a cross-sectional view illustrating a semiconductor package according to an example embodiment of the inventive concepts.

FIG. 2 is a cross-sectional view corresponding to the line IB-IB' of FIG. 1A to illustrate a semiconductor package according to an example embodiment of the inventive concepts. Hereinafter, the descriptions to the same elements as in the above example embodiments will be omitted or mentioned briefly for the purpose of ease and convenience in explanation.

Referring to FIGS. 1A and 2, a semiconductor package 2 may include a package substrate 1000, first bumps 710, a first substrate 100, a second substrate 200, a molding pattern 400, semiconductor chips 500, and second bumps 720. The second bumps 720 may be disposed between the package substrate 1000 and the second substrate 200. The second substrate 200 may include a second base layer 210, second upper pads 250, an interconnection line 240, and second conductive structures 220. The second base layer 210 may be provided in plurality. The number of the second base layers 210 may be equal to or more than the number of the first base layers 110. The interconnection line 240 may be electrically connected to at least two of the second upper pads 250. The interconnection line 240 may function as a signal transmitting path between the semiconductor chips 500. The second upper pads 250 connected to the interconnection line 240 may function as signal transmitting pads.

The second conductive structure 220 may include a second lower pad 221, second vias 222, and a second conductive pattern 223. The second conductive structure 220 may be electrically connected to a corresponding one of the second upper pads 250. Hereinafter, the second conductive structure 220 and a single second upper pad 250 connected thereto will be described as an example in the present example embodiment. The second lower pad 221 may be provided on the bottom surface 200b of the second substrate 200. The second conductive pattern 223 may be disposed between the second base layers 210 and may be electrically connected to the second vias 222. The second vias 222 may penetrate at least one of the second base layers 210. The second vias 222 may be disposed between the second lower pad 221 and the second conductive pattern 223 and between the second conductive pattern 223 and the second upper pad 250. The second bump 720 may be provided between the package substrate 1000 and the second lower pad 221 to electrically connect the package substrate 1000 and the second lower pad 221 to each other. The second pads 520 of the semiconductor chips 500 may be electrically connected to the package substrate 1000 through the second connection parts 620, the second upper pads 250, the second conductive structures 220, and the second bumps 720. In some example embodiments, each of the semiconductor chips 500 may be grounded through the second conductive structure 220. In certain example embodiments, an external voltage may be supplied to each of the semiconductor chips 500 through the second conductive structure 220. The second upper pads 250 may not be aligned with the second lower pads 221 in the third direction D3. Thus, the circuit patterns of the semiconductor chips 500 and interconnection lines (not shown) of the package substrate 1000 may be designed with less design constraints. In certain example embodiments, the second conductive pattern 223 may be omitted and the second upper pad 250 may be aligned with the second bump 720 in the third direction D3. The second conductive structure 220 may be electrically isolated from the interconnection line 240. Thus, an electrical short may be prevented from occurring between the second conductive structure 220 and the interconnection line 240.

Figure 3:
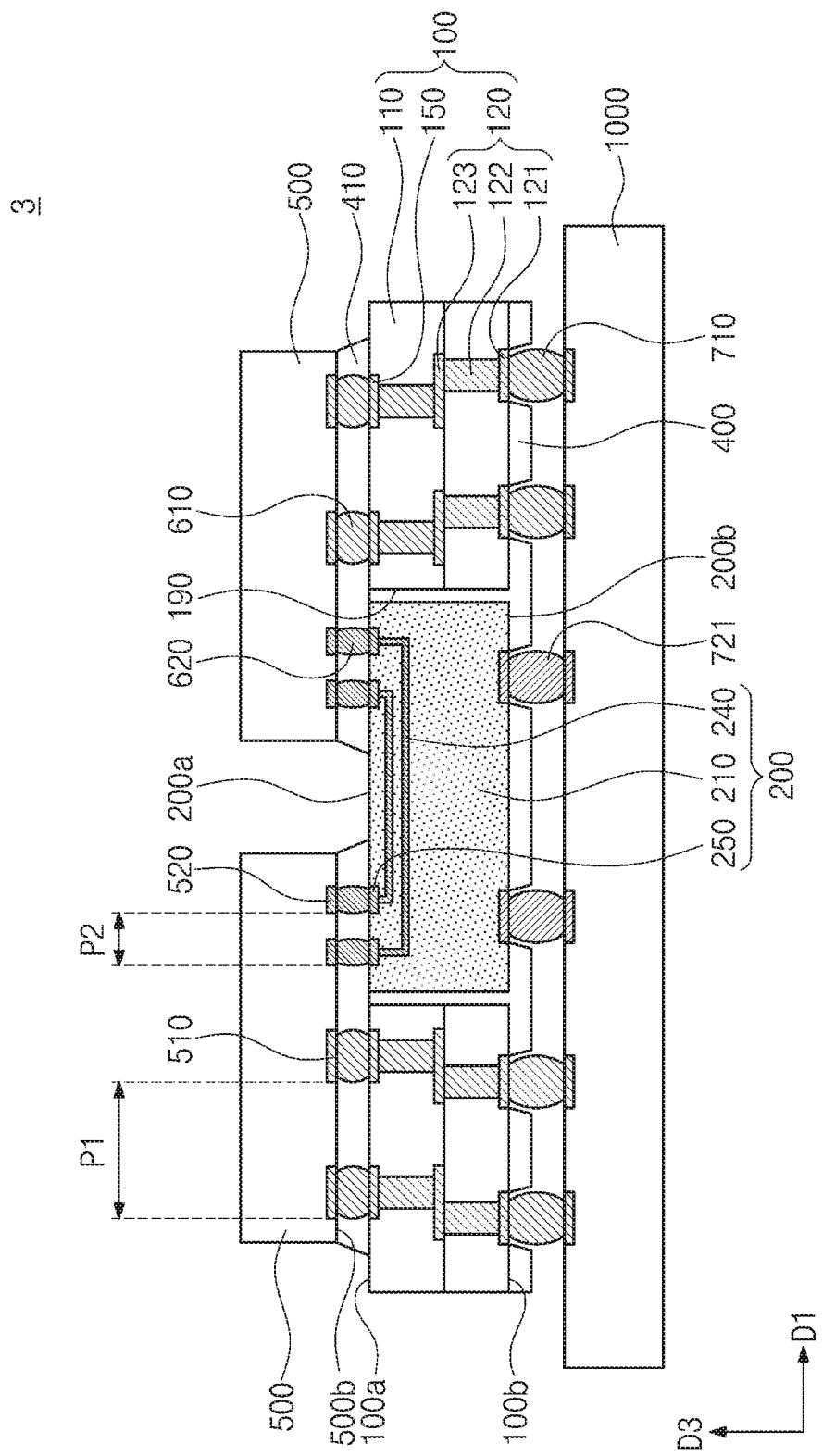
FIG. 3 is a cross-sectional view illustrating a semiconductor package according to an example embodiment of the inventive concepts.

FIG. 3 is a cross-sectional view corresponding to the line IB-IB' of FIG. 1A to illustrate a semiconductor package according to an example embodiment of the inventive concepts. Hereinafter, the descriptions to the same elements as in the above example embodiments will be omitted or mentioned briefly for the purpose of ease and convenience in explanation.

Referring to FIGS. 1A and 3, a semiconductor package 3 may include a package substrate 1000, first bumps 710, a first substrate 100, a second substrate 200, a molding pattern 400, semiconductor chips 500, and a dummy bump 721. The package substrate 1000, the first bumps 710, the first substrate 100, the second substrate 200, and the semiconductor chips 500 may be the same as described with reference to FIGS. 1A and 1B. The dummy bump 721 may be disposed between the package substrate 1000 and the second substrate 200. The second substrate 200 may be stably attached onto the package substrate 1000 by the dummy bump 721. The dummy bump 721 may be electrically isolated from conductive elements included in the package substrate 1000, conductive elements included in the second substrate 200, and the semiconductor chips 500. For example, the dummy bump 721 may be electrically isolated from the interconnection line 240. Further, the dummy bump 721 may be electrically isolated from the first bumps 710.

Figure 4:
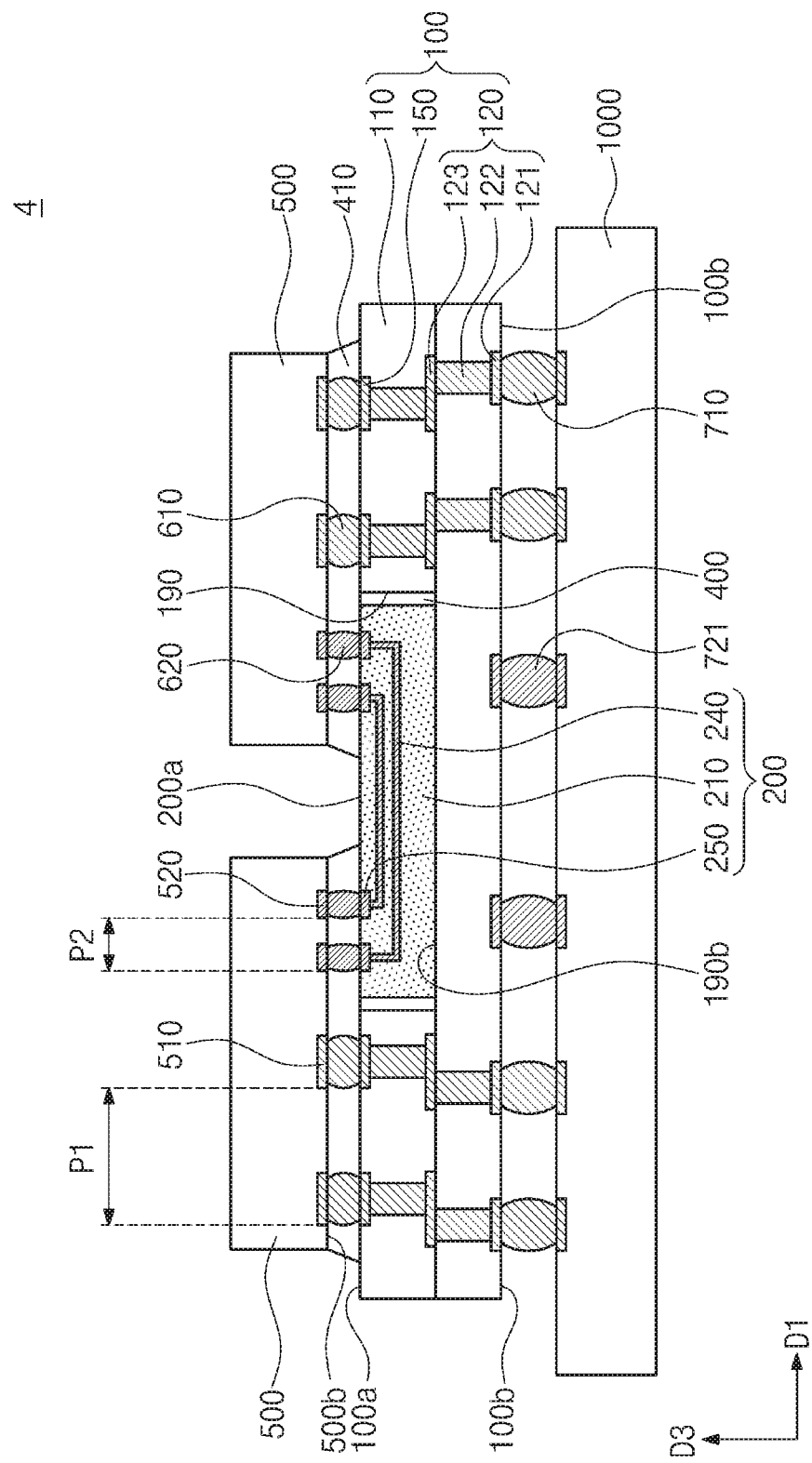
FIG. 4 is a cross-sectional view illustrating a semiconductor package according to an example embodiment of the inventive concepts.

FIG. 4 is a cross-sectional view corresponding to the line IB-IB' of FIG. 1A to illustrate a semiconductor package according to an example embodiment of the inventive concepts. Hereinafter, the descriptions to the same elements as in the above example embodiments will be omitted or mentioned briefly for the purpose of ease and convenience in explanation.

Referring to FIGS. 1A and 4, a semiconductor package 4 may include a package substrate 1000, first bumps 710, a first substrate 100, a second substrate 200, a molding pattern 400, and semiconductor chips 500. The first substrate 100 may have a hole 190. The hole 190 may extend from a top surface 100a of the first substrate 100 toward a bottom surface 100b of the first substrate 100. The hole 190 may not penetrate the bottom surface 100b of the first substrate 100. A bottom surface 190b of the hole 190 may be provided in the first substrate 100. Thus, the bottom surface 190b of the hole 190 may be spaced apart from the bottom surface 100b of the first substrate 100.

The second substrate 200 may be embedded in the hole 190 of the first substrate 100. For example, the second substrate 200 may be disposed on the bottom surface 190b of the hole 190. A thickness of the second substrate 200 may be smaller than a thickness of the first substrate 100. The second substrate 200 may be spaced apart from an inner sidewall of the hole 190. The molding pattern 400 may be provided in the hole 190. The molding pattern 400 may fill a gap between the first substrate 100 and the second substrate 200.

The first bumps 710 may be provided between the package substrate 1000 and first conductive structures 120. The semiconductor chips 500 may be electrically connected to the package substrate 1000 through the first conductive structures 120 and the first bumps 710.

A dummy bump 721 may further be disposed between the package substrate 1000 and the first substrate 100. The dummy bump 721 may support the first substrate 100.

Figure 5:
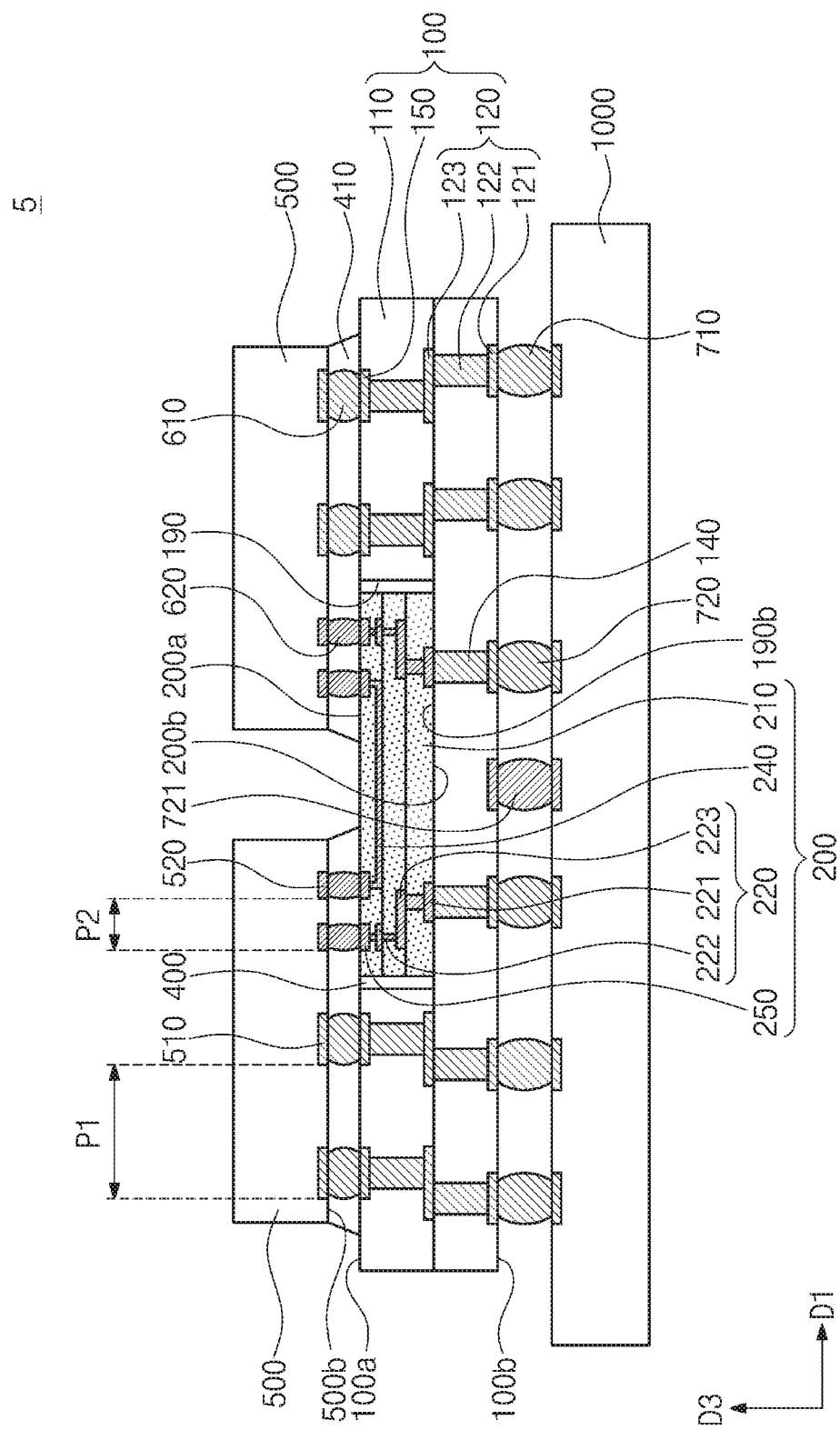
FIG. 5 is a cross-sectional view illustrating a semiconductor package according to an example embodiment of the inventive concepts.

FIG. 5 is a cross-sectional view corresponding to the line IB-IB' of FIG. 1A to illustrate a semiconductor package according to an example embodiment of the inventive concepts. Hereinafter, the descriptions to the same elements as in the above example embodiments will be omitted or mentioned briefly for the purpose of ease and convenience in explanation.

Referring to FIGS. 1A and 5, a semiconductor package 5 may include a package substrate 1000, first bumps 710, a first substrate 100, a second substrate 200, a molding pattern 400, semiconductor chips 500, and second bumps 720. The bottom surface 190b of the hole 190 of the first substrate 100 may be provided in the first substrate 100. The first substrate 100 may include the first base layers 110 and the first conductive structures 120 and may further include a connection via 140. The connection via 140 may penetrate at least one of the first base layers 110. For example, the connection via 140 may be provided between the bottom surface 100b of the first substrate 100 and the bottom surface 190b of the hole 190. The connection via 140 may overlap with the hole 190 when viewed in a plan view. The connection via 140 may be insulated from the first conductive structures 120.

The second substrate 200 may be disposed on the bottom surface 190b of the hole 190 and may be spaced apart from the inner sidewall of the hole 190. The second substrate 200 may include a second base layer 210, second upper pads 250, an interconnection line 240, and second conductive structures 220. The second base layer 210 may include a plurality of second base layers 210 sequentially stacked. The second conductive structure 220 may include a second lower pad 221, second vias 222, and a second conductive pattern 223. The second conductive structure 220 may include the second lower pad 221, and thus the second conductive structure 220 may be exposed at the bottom surface 200b of the second substrate 200. The second conductive structure 220 may be electrically connected to the connection via 140.

The second bump 720 may be provided between the package substrate 1000 and the bottom surface 100b of the first substrate 100. The second bump 720 may be electrically connected to the connection via 140. Thus, the semiconductor chips 500 may be electrically connected to the package substrate 1000 through the second conductive structures 220. The second conductive structure 220 may function as a ground conductive structure or a power conductive structure. The second conductive structure 220 may be physically spaced apart from the interconnection line 240 and may be electrically isolated from the interconnection line 240. Due to the second conductive structures 220, the circuit patterns of the semiconductor chips 500 and/or interconnection patterns of the package substrate 1000 may be variously designed.

A dummy bump 721 may further be provided between the package substrate 1000 and the first substrate 100. The dummy bump 721 may be physically spaced apart from the first and second bumps 710 and 720 and may be electrically isolated from the first and second bumps 710 and 720.

Figure 6:
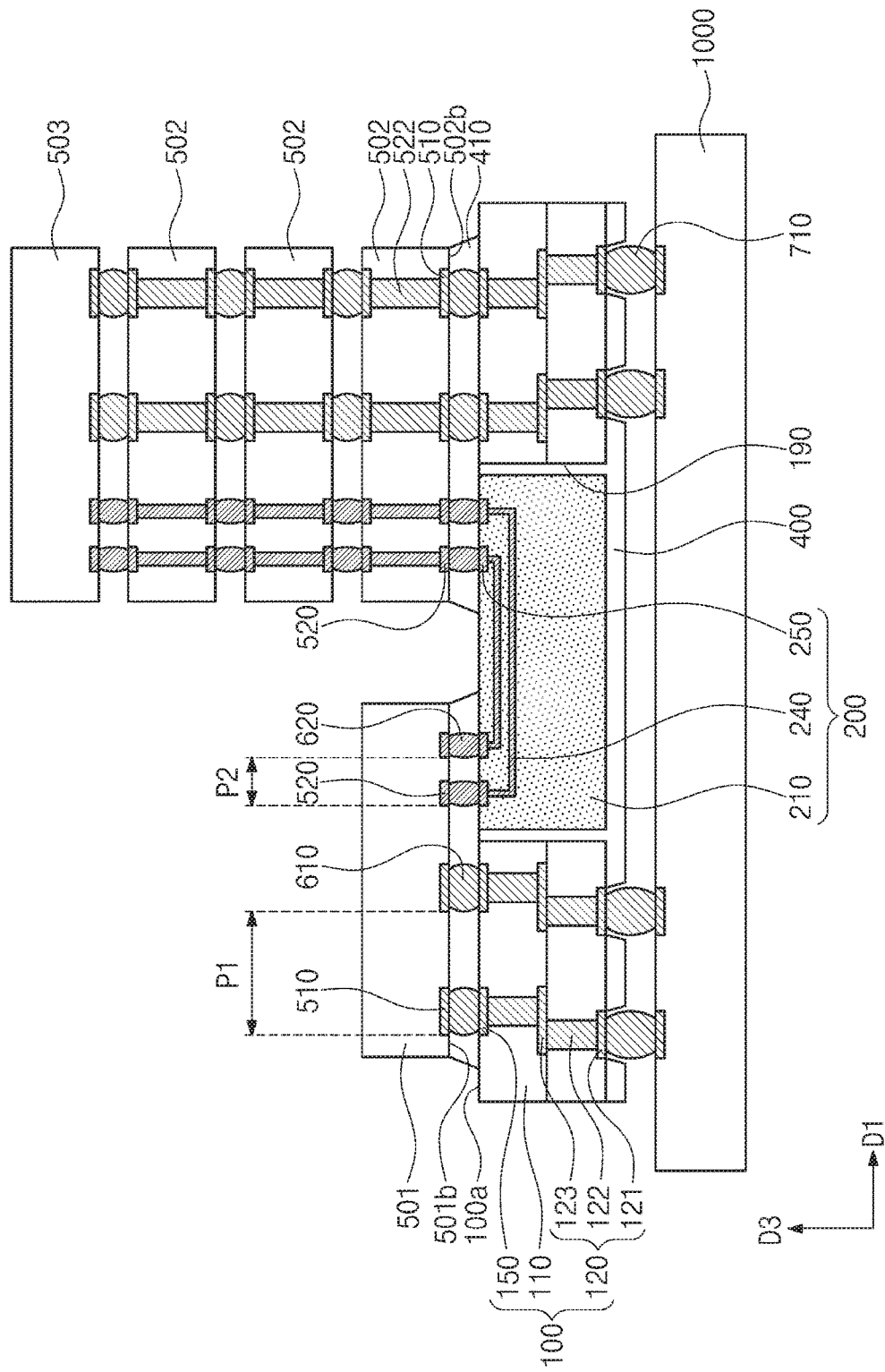
FIG. 6 is a cross-sectional view illustrating a semiconductor package according to an example embodiment of the inventive concepts.

FIG. 6 is a cross-sectional view illustrating a semiconductor package according to an example embodiment of the inventive concepts. Hereinafter, the descriptions to the same elements as in the above example embodiments will be omitted or mentioned briefly for the purpose of ease and convenience in explanation.

Referring to FIGS. 1A and 6, a semiconductor package 6 may include a package substrate 1000, first bumps 710, a first substrate 100, a second substrate 200, a molding pattern 400, underfill layers 410, and semiconductor chips 501, 502, and 503. The semiconductor chips 501, 502, and 503 may include a first semiconductor chip 501, a second semiconductor chip 502, and a third semiconductor chip 503. The first semiconductor chip 501 may be the same as one of the semiconductor chips 500 described with reference to FIGS. 1A and 1B. For example, the first semiconductor chip 501 may be electrically connected to the first substrate 100 and the second substrate 200 through the first connection parts 610 and the second connection parts 620.

The second semiconductor chip 502 may be disposed on the first substrate 100 and the second substrate 200. The second semiconductor chip 502 may be provided in plurality. The second semiconductor chips 502 may be stacked. The second semiconductor chips 502 may be electrically connected to the first substrate 100 and the second substrate 200 through the first connection parts 610 and the second connection parts 620. Through-vias 522 may be provided in the second semiconductor chips 502. The second semiconductor chips 502 may be electrically connected to each other through the through-vias 522. The second semiconductor chips 502 may exchange electrical signals with the first semiconductor chip 501 through the interconnection line 240. The semiconductor chips 502 may be electrically connected to the package substrate 1000 through the first conductive structures 120. The second semiconductor chips 502 may be grounded through the first conductive structures 120 or may be supplied with power voltages through the first conductive structures 120. The number of the second semiconductor chips 502 is not limited to the number of the second semiconductor chips 502 illustrated in FIG. 6, but may be variously changed. In certain example embodiments, a single second semiconductor chip 502 may be provided. Even though not shown in the drawings, the second substrate 200 may further include the second conductive structure 220 of FIG. 2.

The third semiconductor chip 503 may be provided on the second semiconductor chips 502. The third semiconductor chip 503 may not include a through-via. The third semiconductor chip 503 may be electrically connected to the second semiconductor chips 502 through the through-vias 522. The third semiconductor chip 503 may be electrically connected to the first semiconductor chip 501 through the through-vias 522 and the interconnection line 240. The third semiconductor chip 503 may be electrically connected to the package substrate 1000 through the through-vias 522 and the first conductive structures 120.

Figure 7A:
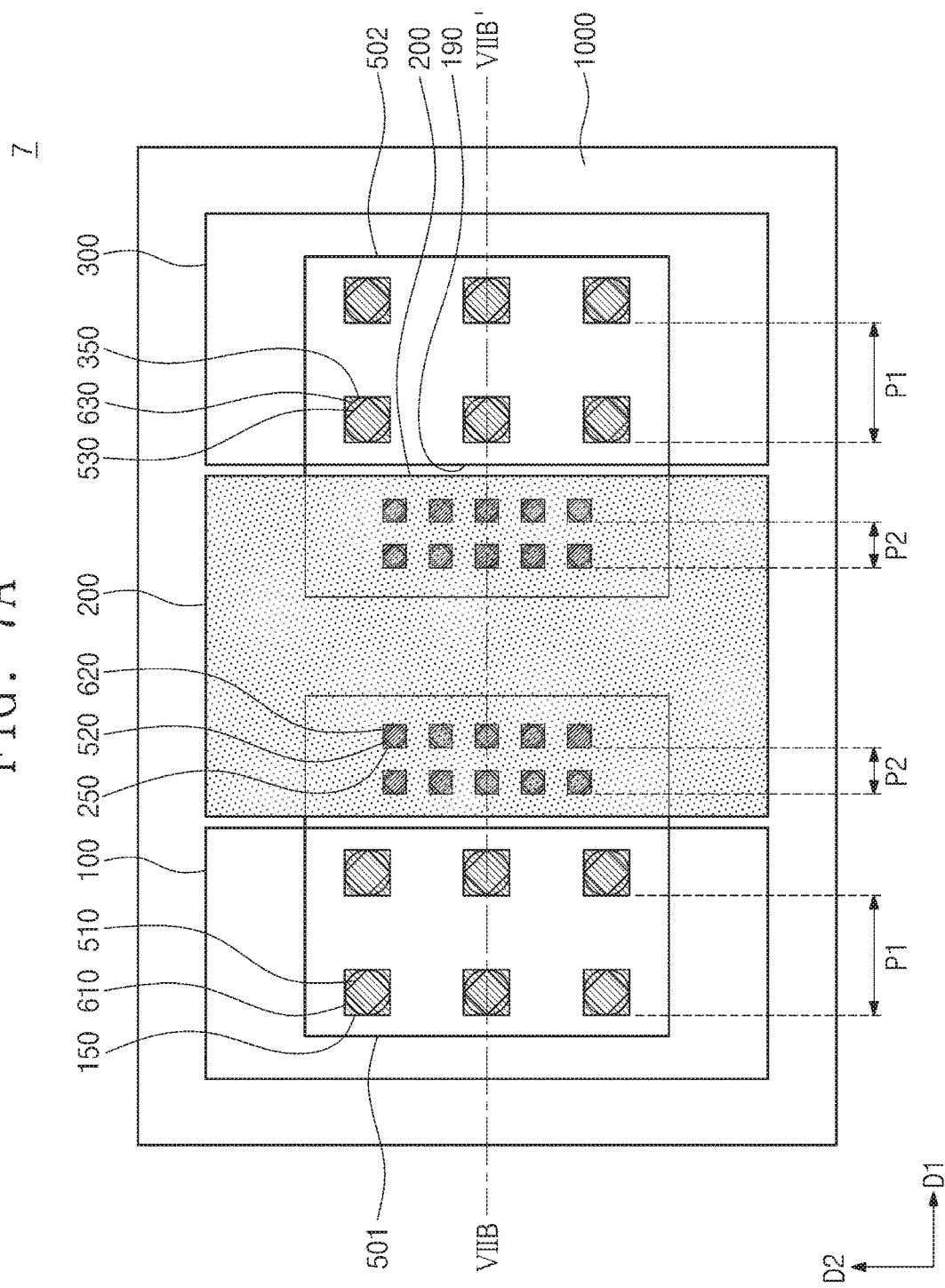
FIG. 7A is a plan view illustrating a semiconductor package according to an example embodiment of the inventive concepts.
Figure 7B:
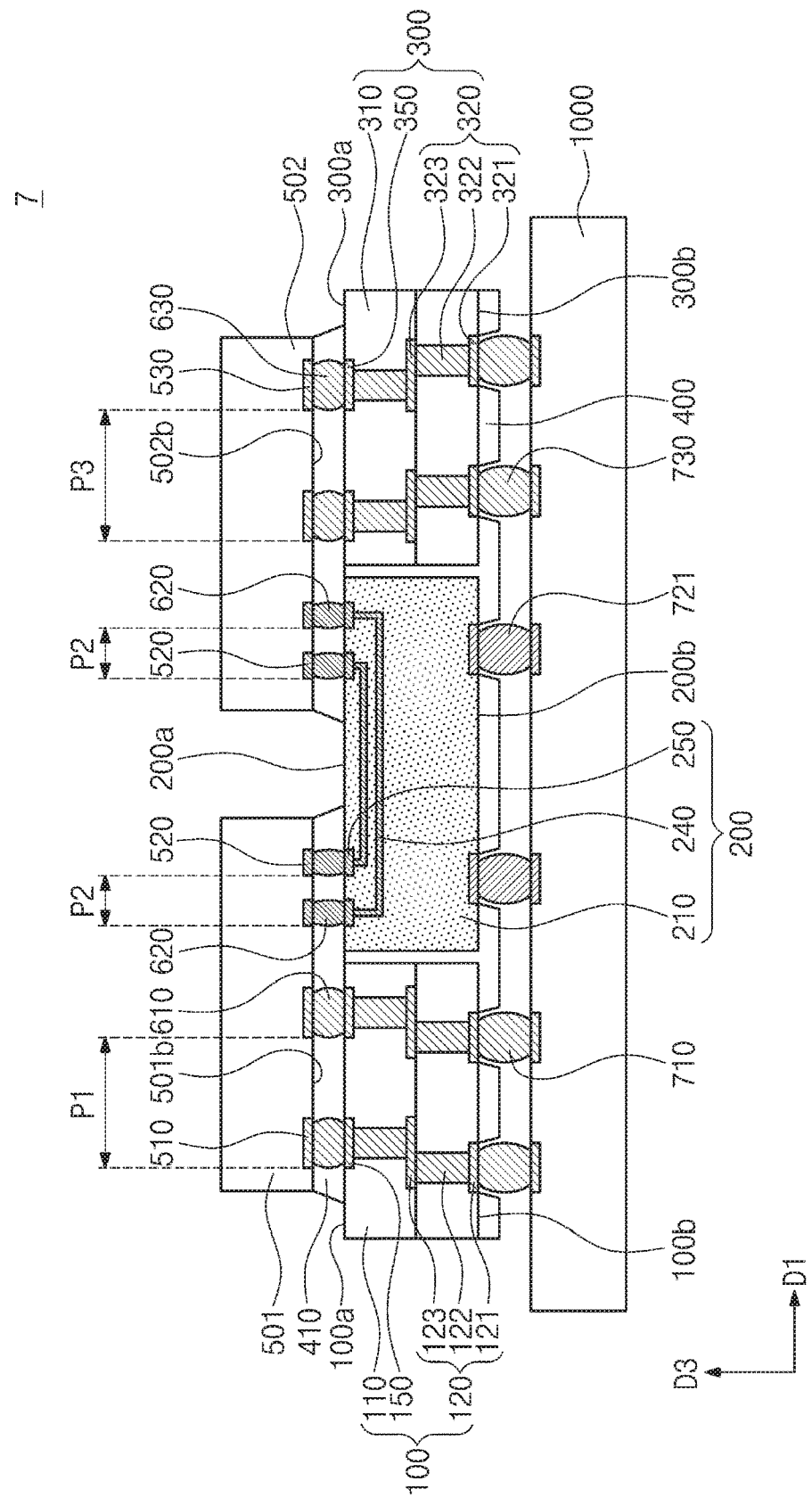
FIG. 7B is a cross-sectional view taken along a line VIIB-VIIB' of FIG. 7A.

FIG. 7A is a plan view illustrating a semiconductor package according to an example embodiment of the inventive concepts. FIG. 7B is a cross-sectional view taken along a line VIIB-VIIB' of FIG. 7A. Hereinafter, the descriptions to the same elements as in the above example embodiments will be omitted or mentioned briefly for the purpose of ease and convenience in explanation.

Referring to FIGS. 7A and 7B, a semiconductor package 7 may include a package substrate 1000, first bumps 710, a first substrate 100, a second substrate 200, a molding pattern 400, semiconductor chips 501 and 502, and a third substrate 300. The first substrate 100 may be provided on the package substrate 1000. The first substrate 100 may include first base layers 110 and first conductive structures 120. The first base layers 110 and the first conductive structures 120 may be substantially the same as described with reference to FIGS. 1A and 1B. The first conductive structures 120 may be electrically connected to the first bumps 710. However, unlike FIGS. 1A and 1B, the first substrate 100 may not have the hole 190.

The second substrate 200 may be provided on the package substrate 1000. The second substrate 200 may be laterally spaced apart from the first substrate 100. For example, the second substrate 200 may be spaced apart from the first substrate 100 in the first direction D1. The second substrate 200 may include second base layers 210, an interconnection line 240, and second upper pads 250. A pitch of the second upper pads 250 may be smaller than a pitch of the first upper pads 150. A dummy bump 721 may be disposed between the package substrate 1000 and the second substrate 200. Even though not shown in the drawings, the second substrate 200 may further include the second conductive structure 220 of FIG. 2.

The third substrate 300 may be provided on the package substrate 1000. The third substrate 300 may be spaced apart from the second substrate 200 in the first direction D1. A top surface 300a of the third substrate 300 may be disposed at substantially the same level as a top surface 200a of the second substrate 200 and a top surface 100a of the first substrate 100. The third substrate 300 may include third base layers 310, third conductive structures 320, and third upper pads 350. The third base layers 310, the third conductive structures 320, and the third upper pads 350 may be substantially the same as the first base layers 110, the first conductive structures 120, and the first upper pads 150 described with reference to FIGS. 1A and 1B, respectively. The third conductive structures 320 may be electrically isolated from each other. The third conductive structures 320 may include third lower pads 321, third vias 322, and third conductive patterns 323. A pitch of the third upper pads 350 may be different from the pitch of the second upper pads 250. For example, the pitch of the third upper pads 350 may be greater than the pitch of the second upper pads 250. The pitch of the third upper pads 350 may be equal to or different from the pitch of the first upper pads 150. Third bumps 730 may be provided between the package substrate 1000 and third substrate 300. The third conductive structures 320 may be electrically connected to the package substrate 1000 through the third bumps 730.

The semiconductor chips 501 and 502 may include a first semiconductor chip 501 and a second semiconductor chip 502. The first semiconductor chip 501 may be mounted on the first substrate 100 and the second substrate 200. The first semiconductor chip 501 may be the same as one of the semiconductor chips 500 described with reference to FIGS. 1A and 1B. For example, first pads 510 and second pads 520 may be provided on one surface 501b of the first semiconductor chip 501. The second pitch P2 of the second pads 520 may be smaller than the first pitch P1 of the first pads 510. The first semiconductor chip 501 may be connected to the first substrate 100 through first connection parts 610. The first semiconductor chip 501 may be electrically connected to the interconnection line 240 of the second substrate 200 through second connection parts 620.

The second semiconductor chip 502 may be mounted on the second substrate 200 and the third substrate 300. The second semiconductor chip 502 may be laterally spaced apart from the first semiconductor chip 501. For example, the second semiconductor chip 502 may be spaced apart from the first semiconductor chip 501 in the first direction D1. One surface 502b of the second semiconductor chip 502 may face the second substrate 200 and the third substrate 300. Second pads 520 and third pads 530 may be provided on the one surface 502b of the second semiconductor chip 502. In a plan view, the second pads 520 of the second semiconductor chip 502 may overlap with the second substrate 200 and the third pads 530 of the second semiconductor chip 502 may overlap with the third substrate 300. The third pads 530 may have a third pitch P3. The second pitch P2 may be different from the third pitch P3. For example, the second pitch P2 may be smaller than the third pitch P3. The third pitch P3 may be equal to or different from the first pitch P1.

The second pads 520 of the second semiconductor chip 502 may be electrically connected to the second substrate 200 through second connection parts 620. The second semiconductor chip 502 may be electrically connected to the first semiconductor chip 501 through the interconnection line 240.

The third pads 530 of the second semiconductor chip 502 may be electrically connected to the package substrate 1000 through the third substrate 300. For example, the third pads 530 of the second semiconductor chip 502 may be electrically connected to the package substrate 1000 through the third conductive structures 320 of the third substrate 300. Third connection parts 630 may be disposed between the third substrate 300 and the second semiconductor chip 502. The third connection parts 630 may be connected to the third upper pads 350 and the third pads 530. The third pitch P3 of the third pads 530 may be substantially equal to a pitch of the third connection parts 630 and a pitch of the third upper pads 350. In some example embodiments, since the third substrate 300 is provided, limitations on designs of the pitches P2 and P3 of the pads 520 and 530 of the second semiconductor chip 502 may be reduced. The third conductive structure 320 may transmit an electrical signal or a voltage to the second semiconductor chip 502 or may ground the second semiconductor chip 502.

The molding pattern 400 may fill a gap between the first and second substrates 100 and 200 and a gap between the second and third substrates 200 and 300. Further, the molding pattern 400 may extend onto a bottom surface 100b of the first substrate 100, a bottom surface 200b of the second substrate 200, and/or a bottom surface 300b of the third substrate 300.

FIGS. 8A to 8E are cross-sectional views corresponding to the line IB-IB' of FIG. 1A to illustrate a method of manufacturing a semiconductor package, according to an example embodiment of the inventive concepts. Hereinafter, the descriptions to the same features as in the above example embodiments will be omitted or mentioned briefly for the purpose of ease and convenience in explanation.

Referring to FIGS. 1 and 8A, a first substrate 100 may be disposed on a support substrate 800. A top surface 100a of the first substrate 100 may be in physical contact with an adhesive layer 810. The first substrate 100 may adhere to the support substrate 800 by the adhesive layer 810. For example, a printed circuit board (PCB) may be used as the first substrate 100. The first substrate 100 may include first base layers 110, first conductive structures 120, and first upper pads 150. The first upper pads 150 may have a first pitch.

Referring to FIGS. 1A and 8B, a hole 190 may be formed in the first substrate 100. For example, a portion of the first substrate 100 may be removed to form the hole 190. The hole 190 may be formed in a central portion of the first substrate 100 when viewed in a plan view. The hole 190 may expose the adhesive layer 810.

Figure 8C:
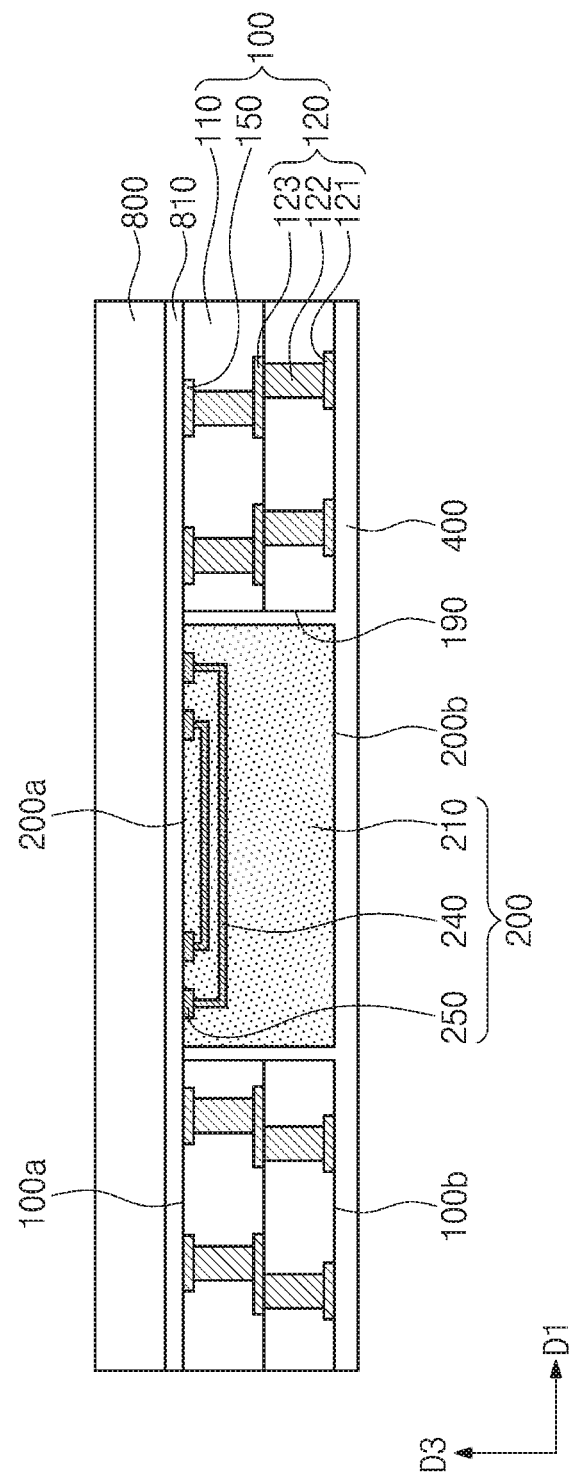

Referring to FIGS. 1A and 8C, a second substrate 200 and a molding pattern 400 may be provided on the support substrate 800. The second substrate 200 may be disposed in the hole 190 of the first substrate 100. A top surface 200a of the second substrate 200 may be adhered to the adhesive layer 810. The top surface 200a of the second substrate 200 may be disposed at the same level as the top surface 100a of the first substrate 100. The second substrate 200 may include a second base layer 210, an interconnection line 240, and second upper pads 250. The second upper pads 250 may have a second pitch. The second pitch may be smaller than the first pitch. The molding pattern 400 may be formed on a bottom surface 100b of the first substrate 100 and a bottom surface 200b of the second substrate 200. Further, the molding pattern 400 may extend into a gap between the first substrate 100 and the second substrate 200.

Figure 8D:
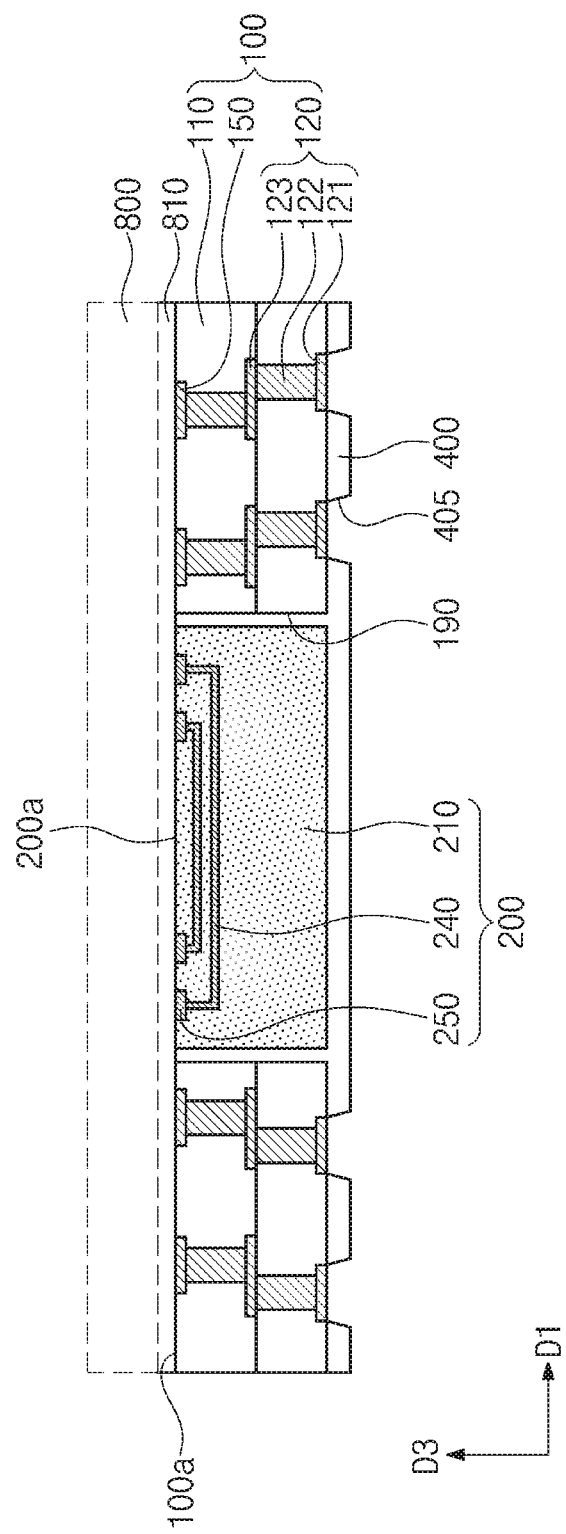

Referring to FIGS. 1A and 8D, portions of the molding pattern 400 may be removed to form openings 405. The openings 405 may be formed in the molding pattern 400. The openings 405 may expose first lower pads 121. Thereafter, the support substrate 800 and the adhesive layer 810 may be removed to expose the top surface 100a of the first substrate 100 and the top surface 200a of the second substrate 200. The top surface 200a of the second substrate 200 may be disposed at substantially the same level as the top surface 100a of the first substrate 100.

Figure 8E:
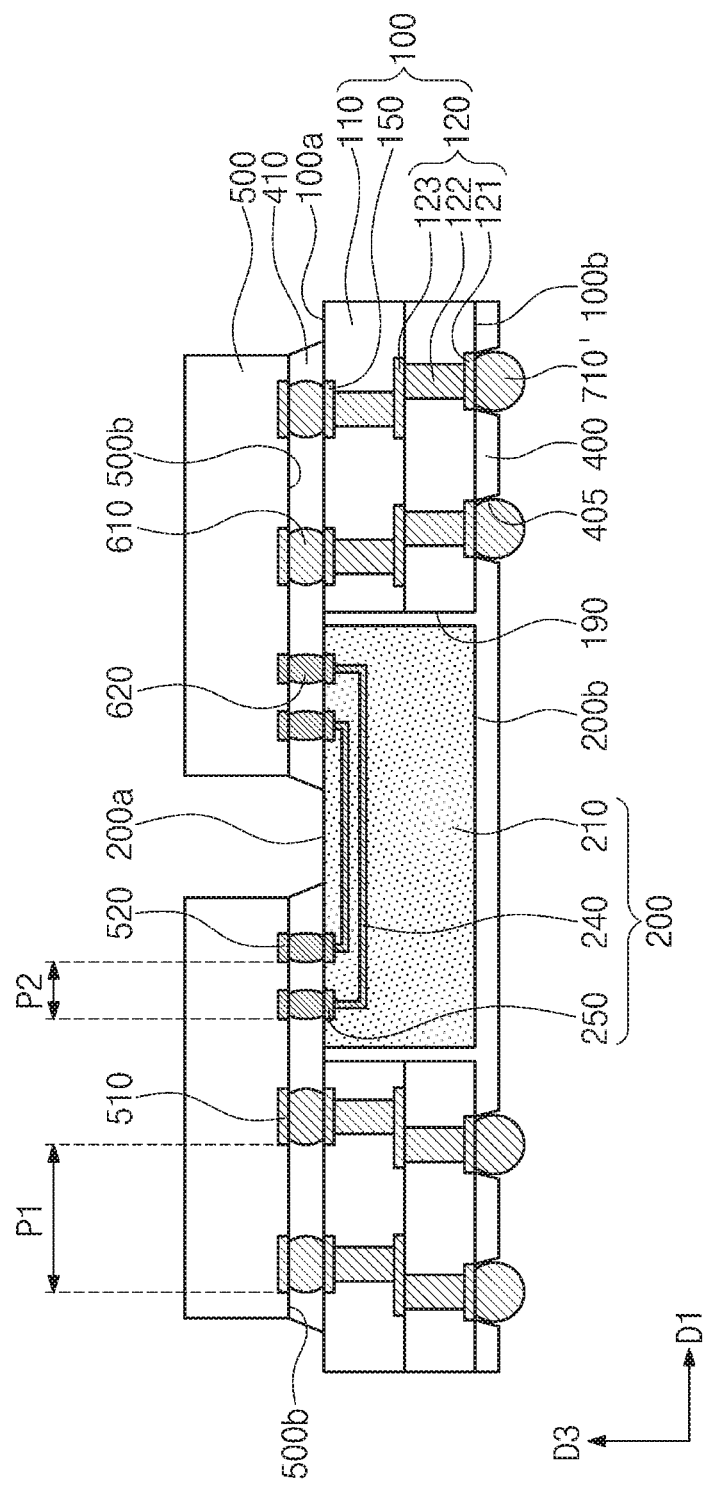

Referring to FIGS. 1A and 8E, semiconductor chips 500 may be mounted on the first substrate 100 and the second substrate 200. For example, first pads 510 and second pads 520 may be formed on one surface 500b of each of the semiconductor chips 500. Each of the semiconductor chips 500 may be disposed on the first substrate 100 and the second substrate 200 in such a way that the first pads 510 and the second pads 520 are aligned with the first upper pads 150 and the second upper pads 250, respectively. First connection parts 610 may be formed between the first upper pads 150 and the first pads 510. The semiconductor chips 500 may be connected to the first substrate 100 through the first connection parts 610. Second connection parts 620 may be formed between the second upper pads 250 and the second pads 520. The semiconductor chips 500 may be connected to the second substrate 200 through the second connection parts 620. Because the top surfaces 100a and 200a of the first and second substrates 100 and 200 are disposed at substantially the same level, the semiconductor chips 500 may be easily mounted on the first and second substrates 100 and 200. Underfill layers 410 may be formed on the surfaces 500b of the semiconductor chips 500. The underfill layers 410 may seal the first connection parts 610 and the second connection parts 620. Solders 710' may be formed on the bottom surface 100b of the first substrate 100 so as to be connected to the first lower pads 121.

Referring again to FIGS. 1A and 1B, the first substrate 100 and the second substrate 200 may be mounted on a package substrate 1000 to manufacture a semiconductor package 1. The solders 710' may be connected to the package substrate 1000 so as to be formed into first bumps 710. In some example embodiments, package solders (not shown) may be formed on the package substrate 1000. The solders 710' of FIG. 8E may come in contact with the package solders, and a reflow process may be performed on the solders 710' and the package solders to form the first bumps 710. The semiconductor chips 500 may be electrically connected to the package substrate 1000 by the first substrate 100 and the first bumps 710.

In certain example embodiments, the semiconductor package 2 of FIG. 2 may be manufactured using the second substrate 200 including the second conductive structure 220 in the manufacturing method of FIGS. 8A to 8E. The dummy bump 721 may further be formed between the package substrate 1000 and the second substrate 200 to manufacture the semiconductor package 3 of FIG. 3.

According to some example embodiments of the inventive concepts, each of the semiconductor chips may have the first pads and the second pads. The pitch of the second pads may be different from the pitch of the first pads. Each of the semiconductor chips may be mounted on the first substrate and the second substrate. The pitch of the second upper pads of the second substrate may be different from the pitch of the first upper pads of the first substrate. By providing such second substrate in the semiconductor package, the first upper pads of the first substrate may be designed and manufactured with less design constraints. As a result, the limitations on the pitch of the pads of the semiconductor chip may be reduced to variously design the circuit patterns of the semiconductor chips.

While the inventive concepts have been described with reference to some example embodiments, it will be apparent to those skilled in the art that various changes and modifications may be made without departing from the spirits and scopes of the inventive concepts. Therefore, it should be understood that the above example embodiments are not limiting, but illustrative. Thus, the scope of the inventive concepts are to be determined by the broadest permissible interpretation of the following claims and their equivalents, and shall not be restricted or limited by the foregoing description.

The invention claimed is:

1. A semiconductor package comprising:
a first substrate including first upper pads and a first lower pad, the first upper pads on a top surface of the first substrate, the first lower pad on a bottom surface of the first substrate;
a second substrate including second upper pads, the second upper pads on a top surface of the second substrate, a pitch of the second upper pads being less than a pitch of the first upper pads;
a first semiconductor chip on and electrically connected to both (i) at least one of the first upper pads and (ii) at least one of the second upper pads; and
a molding pattern on the bottom surface of the first substrate and a bottom surface of the second substrate,
wherein the first lower pad is electrically connected with at least one of the first upper pads, and
wherein the first lower pad is not being vertically aligned the first upper pads.

2. The semiconductor package of claim 1, wherein
the first semiconductor chip includes a plurality of first semiconductor chips, and
the first semiconductor chips are laterally arranged.

3. The semiconductor package of claim 2, wherein
one of the first semiconductor chips is connected to one of the second upper pads,
another of the first semiconductor chips is connected to another of the second upper pads, and
the second substrate includes an interconnection line, the interconnection line connected to both the one of the second upper pads and the another of the second upper pads.

4. The semiconductor package of claim 3, further comprising:
a conductive structure in the second substrate, the conductive structure electrically connected to the at least one of the second upper pads, the conductive structure electrically isolated from the interconnection line; and
a bump on the bottom surface of the second substrate, the bump electrically connected to the conductive structure.

5. The semiconductor package of claim 4, wherein the conductive structure comprises a second lower pad on the bottom surface of the second substrate, and
the second upper pad is not vertically aligned with the second lower pad.

6. The semiconductor package of claim 1, further comprising:
a second semiconductor chip on the first substrate and the second substrate, the second semiconductor chip at a side of the first semiconductor chip; and a third semiconductor chip on the second semiconductor chip.

7. The semiconductor package of claim 1, further comprising:
a third substrate at a side of the second substrate, the third substrate including third upper pads on a top surface of the third substrate; and
a second semiconductor chip on the second substrate and the third substrate, the second semiconductor chip electrically connected to both at least another of the second upper pads and at least one of the third upper pads.

8. The semiconductor package of claim 1, wherein the second substrate includes a printed circuit board.

9. A semiconductor package comprising:
a first substrate having a hole;
a second substrate in the hole of the first substrate;
at least one semiconductor chip on the first substrate and the second substrate;
first connection parts between the first substrate and the semiconductor chip;
second connection parts between the second substrate and the semiconductor chip, a pitch of the second connection parts being less than a pitch of the first connection parts; and
a molding pattern on a bottom surface of the first substrate and a bottom surface of the second substrate and extending into a gap between the first substrate and the second substrate.

10. The semiconductor package of claim 9, wherein the second substrate comprises an interconnection line electrically connected to at least two of the second connection parts.

11. The semiconductor package of claim 10, wherein the at least one semiconductor chip includes a plurality of semiconductor chips, and
one of the semiconductor chips is electrically connected to another of the semiconductor chips through the interconnection line.

12. The semiconductor package of claim 9, wherein the hole penetrates a top surface and the bottom surface of the first substrate, and
the top surface and the bottom surface of the first substrate are opposite to each other.

13. The semiconductor package of claim 9, wherein the hole extends from a top surface of the first substrate toward the bottom surface of the first substrate in the first substrate, and
a bottom of the hole is in the first substrate, and is spaced apart from the bottom surface of the first substrate.

14. A semiconductor package comprising:
a first substrate including first substrate pads on a first surface thereof, the first substrate pads having a first pitch;
a second substrate including second substrate pads on a first surface thereof, the second substrate pads having a second pitch, the second pitch being less than the first pitch;
a first semiconductor chip including first chip pads and second chip pads, the first chip pads having a third pitch, the second chip pads having a fourth pitch, the fourth pitch being less than the third pitch, the first semiconductor chip on both at least one of the first substrate pads and at least one of the second substrate pads such that one of the first chip pads is electrically coupled to the at least one of the first substrate pads and one of the second chip pads is electrically coupled to the at least one of the second substrate pads; and a molding pattern on a second surface of the first substrate and a second surface of the second substrate, the molding pattern extending into a gap between the first substrate and the second substrate, wherein the first surface and the second surface of the first substrate are opposite to each other, and wherein the first surface and the second surface of the second substrate are opposite to each other.

15. The semiconductor package of claim 14, further comprising:

a first connection part electrically coupling the one of the first chip pads with the at least one of the first substrate pads; and a second connection part electrically coupling the one of the second chip pads with the at least one of the second substrate pads.

16. The semiconductor package of claim 14, wherein the second substrate comprises an interconnection line electrically connecting at least two of the second substrate pads to each other.

17. The semiconductor package of claim 14, wherein the first substrate includes a hole partially or entirely penetrating therethrough, and the second substrate is accommodated in the hole.

18. The semiconductor package of claim 14, further comprising:

a package substrate; and a plurality of bumps between the package substrate and at least one of the first substrate and the second substrate.

* * * * *